(12) United States Patent
Endo

(10) Patent No.: US 10,686,086 B2
(45) Date of Patent: Jun. 16, 2020

(54) PHOTOELECTRIC CONVERSION DEVICE, MANUFACTURING METHOD THEREOF, AND APPARATUS

(71) Applicant: CANON KABUSHIKI KAISHA, Tokyo (JP)

(72) Inventor: Nobuyuki Endo, Fujisawa (JP)

(73) Assignee: CANON KABUSHIKI KAISHA, Tokyo (JP)

(*) Notice: Subject to any disclaimer, the term of this patent is extended or adjusted under 35 U.S.C. 154(b) by 0 days.

(21) Appl. No.: 16/163,926

(22) Filed: Oct. 18, 2018

(65) Prior Publication Data

US 2019/0131468 A1 May 2, 2019

(30) Foreign Application Priority Data

Oct. 27, 2017 (JP) ................................. 2017-208513

(51) Int. Cl.
*H01L 31/0264* (2006.01)
*H01L 31/0352* (2006.01)
(Continued)

(52) U.S. Cl.
CPC ...... *H01L 31/0264* (2013.01); *H01L 27/1461* (2013.01); *H01L 27/14689* (2013.01);
(Continued)

(58) Field of Classification Search
CPC ......... H01L 31/0264; H01L 31/035272; H01L 31/02327; H01L 31/036; H01L 31/18;
(Continued)

(56) References Cited

U.S. PATENT DOCUMENTS 5,466,612 A * 11/1995 Fuse .................. H01L 31/1804
438/60
7,605,415 B2 10/2009 Koizumi et al.
(Continued)

FOREIGN PATENT DOCUMENTS

JP 2003-282858 A 10/2003
JP 2006-024907 A 1/2006
(Continued)

OTHER PUBLICATIONS

Extended European Search Report in European Application No. 18201016.5 (dated Mar. 20, 2019).

*Primary Examiner* — Dao H Nguyen
(74) *Attorney, Agent, or Firm* — Venable LLP

(57) ABSTRACT

A photoelectric conversion device comprises a semiconductor substrate including a photoelectric conversion portion, a silicon oxide film arranged above the photoelectric conversion portion, and an insulating film arranged between the photoelectric conversion portion and the silicon oxide film. An n-type first impurity region constituting part of the photoelectric conversion portion and a p-type second impurity region arranged between the insulating film and the first impurity region are provided in the semiconductor substrate. A portion of the insulating film above the second impurity region, and the second impurity region contain boron. An integrated value of a boron concentration from the surface of the semiconductor substrate to a first position where a boron concentration takes a minimal value in the second impurity region is larger than that from the surface of the semiconductor substrate to an upper surface of the silicon oxide film.

26 Claims, 5 Drawing Sheets

(51) Int. Cl.
*H01L 31/18* (2006.01)
*H01L 31/0232* (2014.01)
*H01L 31/036* (2006.01)
*H01L 27/146* (2006.01)

(52) U.S. Cl.
CPC .. *H01L 27/14698* (2013.01); *H01L 31/02327* (2013.01); *H01L 31/036* (2013.01); *H01L 31/035272* (2013.01); *H01L 31/18* (2013.01); *H01L 27/14643* (2013.01)

(58) Field of Classification Search
CPC ......... H01L 27/14689; H01L 27/14698; H01L 27/14643; H01L 27/1461
USPC ........ 257/432, 443, 446, 292, 231, E27.153, 257/E31.084, E31.122; 438/57, 59, 60, 438/73, 78, 682
See application file for complete search history.

(56) References Cited

U.S. PATENT DOCUMENTS

| | | | |
|---|---|---|---|
| 7,737,519 B2 | 6/2010 | Tamura et al. | |
| 7,943,975 B2 | 5/2011 | Koizumi et al. | |
| 8,207,561 B2 | 6/2012 | Koizumi et al. | |
| 8,546,902 B2 | 10/2013 | Tamura et al. | |
| 8,551,873 B2 * | 10/2013 | Onuki | H01L 21/28247 257/E21.19 |
| 8,624,307 B2 | 1/2014 | Koizumi et al. | |
| 8,809,914 B2 * | 8/2014 | Suzuki | H01L 31/02325 257/232 |
| 2003/0151076 A1 | 8/2003 | Kim | |
| 2004/0180458 A1 | 9/2004 | Kim | |
| 2005/0088551 A1 * | 4/2005 | Lee | H01L 21/76805 348/272 |
| 2005/0269604 A1 | 12/2005 | Koizumi et al. | |
| 2006/0060854 A1 | 3/2006 | Wakano et al. | |
| 2006/0219867 A1 | 10/2006 | Yamaguchi et al. | |
| 2007/0108487 A1 | 5/2007 | Inoue et al. | |
| 2008/0012088 A1 | 1/2008 | Yamaguchi et al. | |
| 2008/0036019 A1 | 2/2008 | Tamura et al. | |
| 2008/0251822 A1 | 10/2008 | Yamaguchi et al. | |
| 2009/0068787 A1 | 3/2009 | Wakano et al. | |
| 2010/0020212 A1 | 1/2010 | Koizumi et al. | |
| 2010/0026866 A1 * | 2/2010 | Matsumoto | H01L 27/14609 348/308 |
| 2010/0219497 A1 | 9/2010 | Tamura et al. | |
| 2011/0175150 A1 | 7/2011 | Koizumi et al. | |
| 2011/0242390 A1 * | 10/2011 | Sogoh | H01L 27/14609 348/311 |
| 2011/0298079 A1 * | 12/2011 | Kawahito | H01L 27/14603 257/443 |
| 2012/0280295 A1 | 11/2012 | Koizumi et al. | |
| 2014/0346578 A1 * | 11/2014 | Hirota | H01L 27/14614 257/292 |
| 2016/0126284 A1 * | 5/2016 | Kato | H01L 27/14685 257/292 |
| 2016/0284758 A1 | 9/2016 | Hirota | |
| 2016/0353044 A1 * | 12/2016 | Kawano | H01L 27/14643 |
| 2017/0256582 A1 | 9/2017 | Futatsugi | |

FOREIGN PATENT DOCUMENTS

| | | |
|---|---|---|
| JP | 2006-073607 A | 3/2006 |
| JP | 2006-286933 A | 10/2006 |
| JP | 2007-134581 A | 5/2007 |
| JP | 2007-208052 A | 8/2007 |
| JP | 2008-021875 A | 1/2008 |
| JP | 2008-091781 A | 4/2008 |
| JP | 2009-158988 A | 7/2009 |
| JP | 2012-044219 A | 3/2012 |
| JP | 2013-062537 A | 4/2013 |
| JP | 2014-007414 A | 1/2014 |
| JP | 2014-154793 A | 8/2014 |
| JP | 2017-157788 A | 9/2017 |
| KR | 10-0746472 B1 | 8/2007 |

* cited by examiner

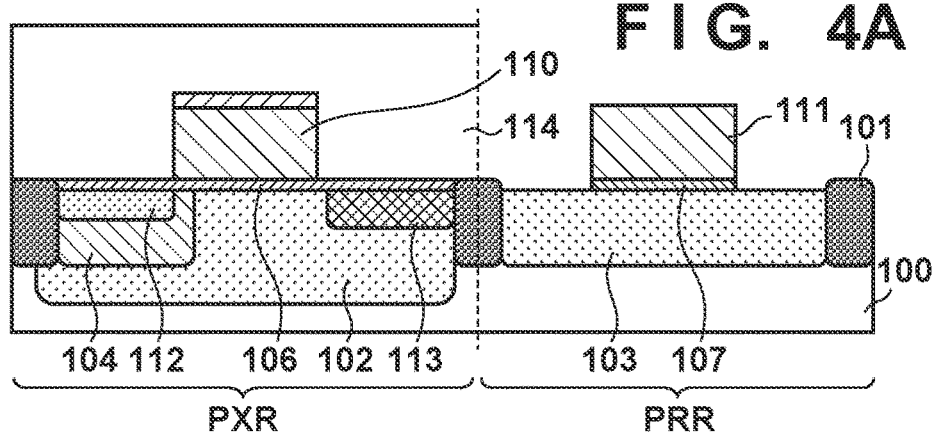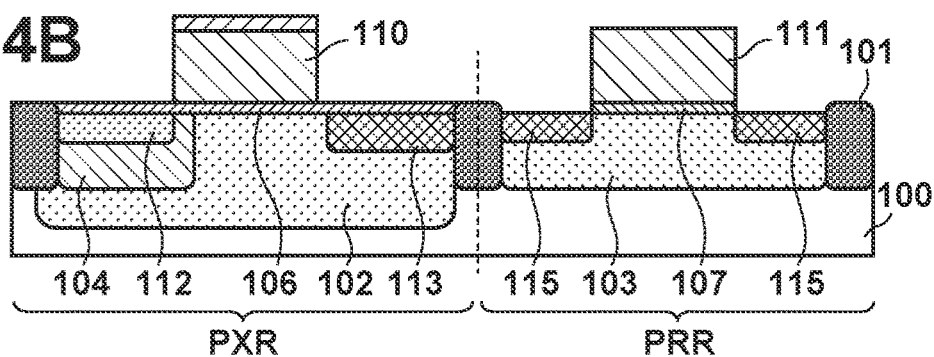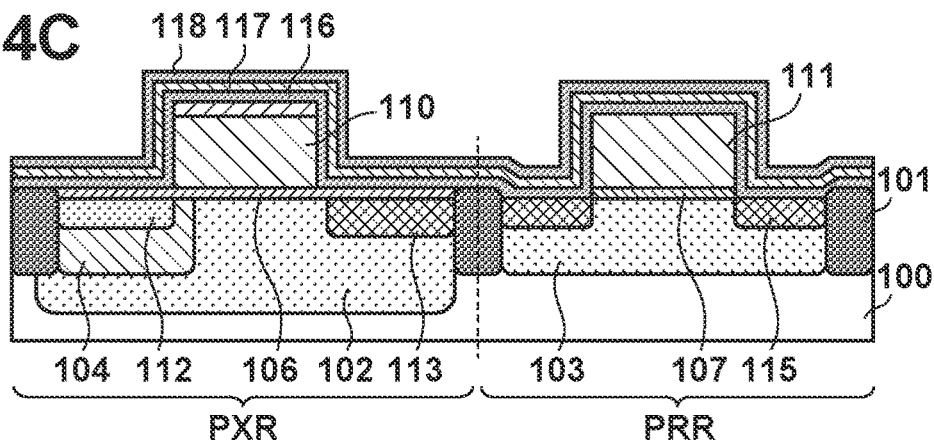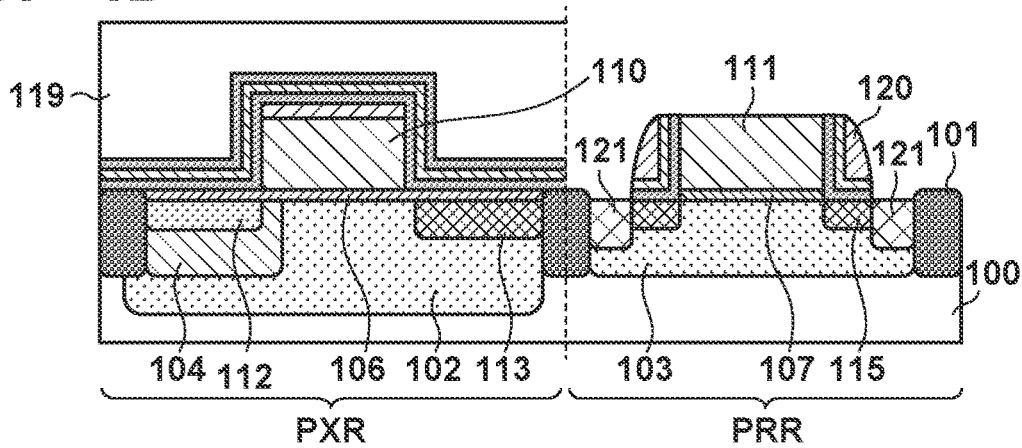

PHOTOELECTRIC CONVERSION DEVICE, MANUFACTURING METHOD THEREOF, AND APPARATUS

BACKGROUND OF THE INVENTION

Field of the Invention

The present invention relates to a photoelectric conversion device, a manufacturing method thereof, and an apparatus.

Description of the Related Art

In a solid-state photoelectric conversion device, a p-type impurity region containing an impurity such as boron is formed in the surface region of a photoelectric conversion portion in order to suppress a white spot or a dark current arising from an interface state or a crystal defect. When the p-type impurity region is formed from boron in the surface region of the photoelectric conversion portion, boron may be trapped in an insulating film such as a silicon oxide film covering the photoelectric conversion portion owing to thermal diffusion or the like. Japanese Patent Laid-Open No. 2007-208052 proposes a method of forming a diffusion barrier layer such as a silicon nitride film between a photoelectric conversion portion and a silicon oxide film.

SUMMARY OF THE INVENTION

The micropatterning process advances lowering of the temperature in the manufacturing process of a photoelectric conversion device. High-temperature thermal processing aimed at crystal defect recovery cannot be performed in this manufacturing process, so boron is doped near the surface of a semiconductor substrate. Boron is readily trapped in the silicon oxide film, and the sensor characteristics of the photoelectric conversion device are impaired (for example, a white spot and a dark current increase). An aspect of the present invention provides a technique for improving the sensor characteristics of a photoelectric conversion device.

According to some embodiments, a photoelectric conversion device comprising: a semiconductor substrate including a photoelectric conversion portion; a silicon oxide film arranged above the photoelectric conversion portion; and an insulating film arranged between the photoelectric conversion portion and the silicon oxide film, wherein an n-type first impurity region constituting part of the photoelectric conversion portion and a p-type second impurity region arranged between the insulating film and the first impurity region are provided in the semiconductor substrate, a portion of the insulating film above the second impurity region, and the second impurity region contain boron, and as for a profile of a boron concentration on a straight line that crosses a surface of the semiconductor substrate and passes through the second impurity region, letting a position where the boron concentration takes a minimal value in the second impurity region be a first position, an integrated value of a boron concentration from the surface of the semiconductor substrate to the first position is larger than an integrated value of a boron concentration from the surface of the semiconductor substrate to an upper surface of the silicon oxide film, is provided.

Further features of the present invention will become apparent from the following description of exemplary embodiments (with reference to the attached drawings).

BRIEF DESCRIPTION OF THE DRAWINGS

FIGS. 4A to 4D are views for explaining an example of the method of manufacturing the photoelectric conversion device according to the embodiment of the present invention.

DESCRIPTION OF THE EMBODIMENTS

Figure 1A:
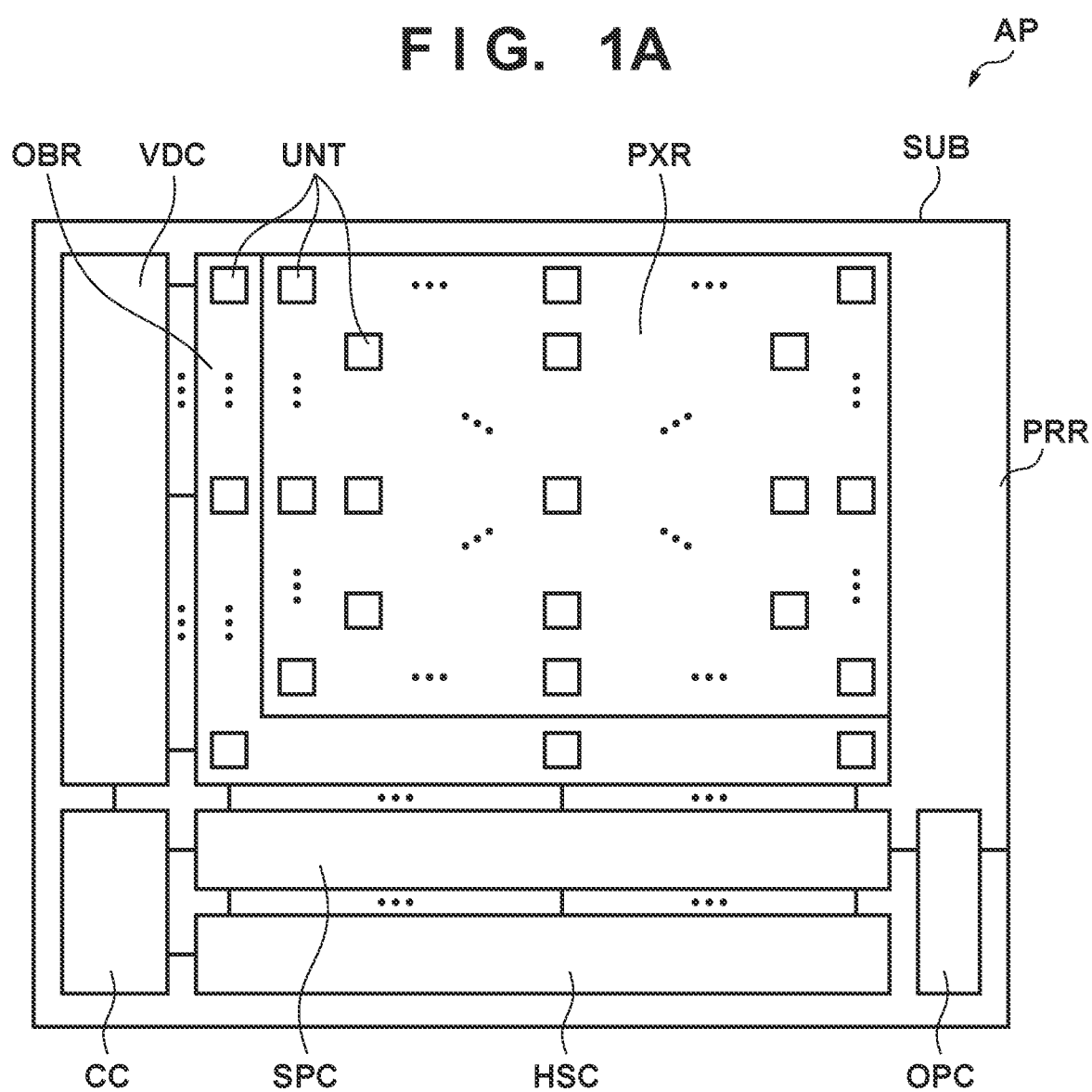
FIGS. 1A and 1B are views for explaining an example of the arrangement of a photoelectric conversion device according to an embodiment of the present invention.

Embodiments of the present invention will now be described with reference to the accompanying drawings. The same reference numerals denote the same parts throughout various embodiments and a repetitive description thereof will be omitted. Embodiments can be properly changed and combined.

An example of the arrangement of a photoelectric conversion device AP according to some embodiments will be described with reference to FIG. 1A. The photoelectric conversion device AP may also be called a solid-state photoelectric conversion device. The arrangement of the photoelectric conversion device AP may be an existing one and an example of the arrangement will be explained simply below. The photoelectric conversion device AP is constituted by forming various circuits on a semiconductor substrate SUB. The photoelectric conversion device AP may be mounted in a package.

The semiconductor substrate SUB includes a pixel region PXR, an optical black region OBR, and a peripheral circuit region PRR. A plurality of pixels UNT are two-dimensionally arranged in the pixel region PXR. Each pixel UNT includes a photoelectric conversion portion configured to convert light into charges and a transfer transistor configured to transfer the converted charges to a succeeding circuit. The transfer transistor is, for example, a MOS transistor. Each pixel UNT may additionally include an existing circuit configured to generate an electrical signal corresponding to incident light.

The optical black region OBR is arranged around the pixel region PXR. A plurality of pixels UNT are arranged even in the optical black region OBR. The pixel UNT arranged in the optical black region OBR may have the same structure as that of the pixel UNT arranged in the pixel region PXR. Light entering the photoelectric conversion device AP reaches each pixel UNT of the pixel region PXR. In contrast, each pixel UNT of the optical black region OBR is shielded from light and no incident light reaches it.

In the peripheral circuit region PRR, a vertical driving circuit VDC, a control circuit CC, a horizontal scanning circuit HSC, a signal processing circuit SPC, and an output processing circuit OPC are arranged. The vertical driving circuit VDC controls the operation of each pixel UNT by supplying a driving signal to each pixel UNT. The control circuit CC controls the overall operation of the photoelectric conversion device AP. The horizontal scanning circuit HSC sequentially reads out signals from the respective pixels UNT. The signal processing circuit SPC amplifies a signal read out from the pixel UNT. The output processing circuit OPC performs processing of outputting to the outside of the photoelectric conversion device AP a signal supplied from the signal processing circuit SPC.

Figure 1B:
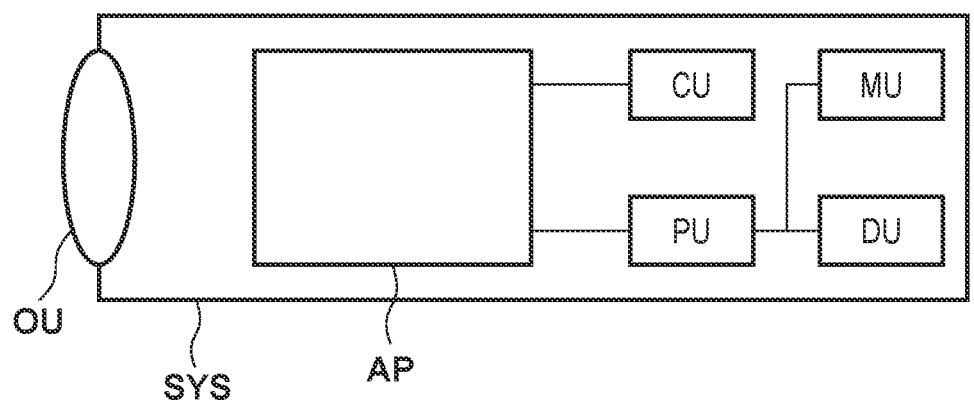

An example of the arrangement of an apparatus SYS equipped with the photoelectric conversion device AP according to some embodiments will be described with reference to FIG. 1B. The arrangement of the apparatus SYS may be an existing one and an example of the arrangement will be explained simply below. The apparatus SYS may be an electronic apparatus having an image capturing function such as a camera or a smartphone, or a transport apparatus such as an automobile or a drone (unmanned air vehicle). The apparatus SYS includes an optical system OU, the photoelectric conversion device AP, a control device CU, a processing device PU, a mechanical device MU, and a display device DU. Some of these constituent elements may be omitted in accordance with the configuration of the apparatus SYS. The optical system OU is, for example, a lens and collects light coming from the outside of the apparatus SYS to the photoelectric conversion device AP. The control device CU controls the operations of the respective components in the apparatus SYS including the photoelectric conversion device AP. The processing device PU includes, for example, an image processing engine and processes an image supplied from the photoelectric conversion device AP. The display device DU displays a processed image. The mechanical device MU performs lens driving and a shutter operation. When the apparatus SYS is a transport device, the mechanical device MU may include an engine and a motor and the control device CU performs operation control of the apparatus SYS using an image obtained by the photoelectric conversion device AP.

Figure 2:
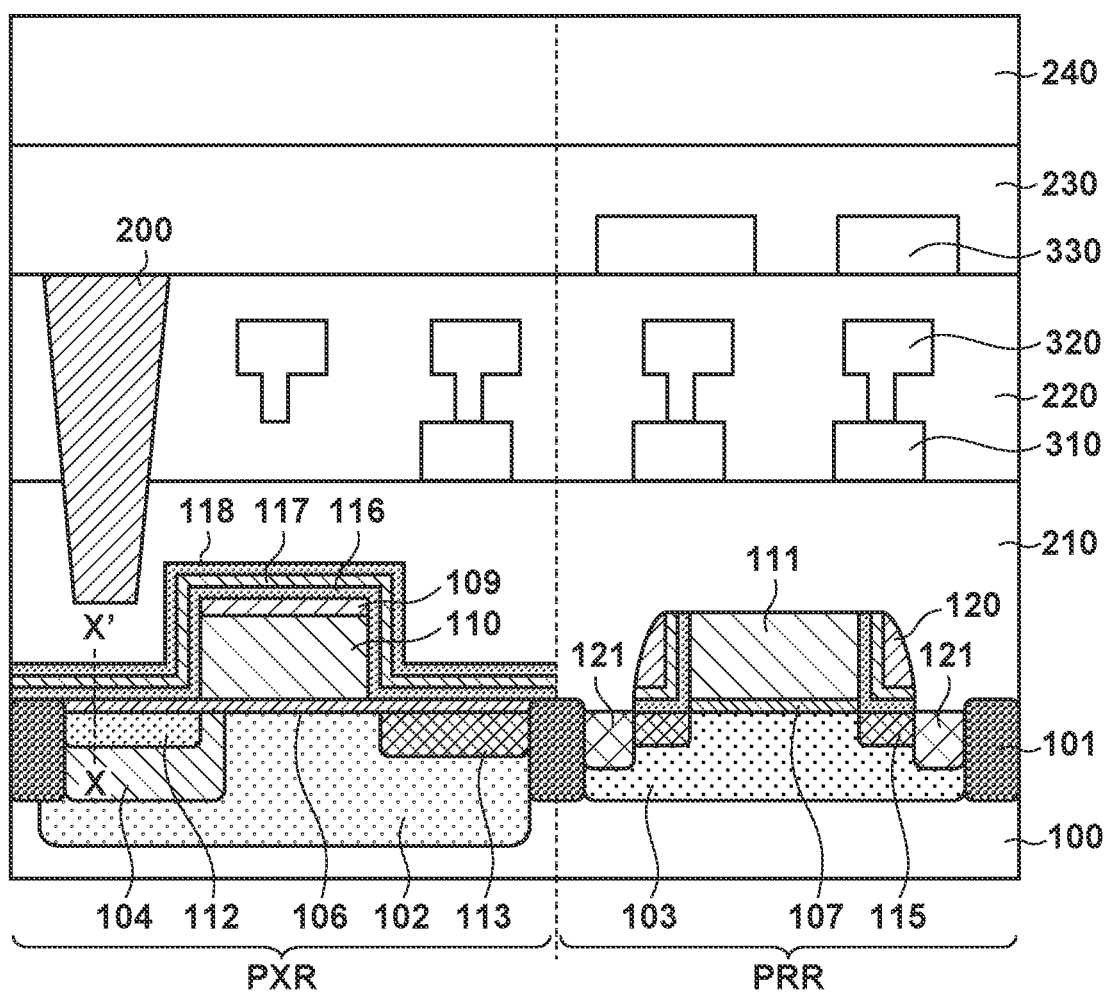
FIG. 2 is a view for explaining an example of the sectional structure of the photoelectric conversion device according to the embodiment of the present invention.

An example of the sectional structure of the photoelectric conversion device AP will be described with reference to FIG. 2. In the drawings, the pixel region PXR and the peripheral circuit region PRR are adjacent to each other for descriptive convenience. In FIG. 2, attention is paid to a photoelectric conversion portion and a transfer transistor included in the pixel region PXR and a transistor included in the peripheral circuit region PRR. The transistor in the peripheral circuit region PRR is, for example, a MOS transistor and constitutes part of any of the above-described circuits.

A semiconductor substrate 100 of silicon or the like has p-type impurity regions 102 and 103. The semiconductor substrate 100 corresponds to the semiconductor substrate SUB in FIG. 1A. The impurity region 102 is a well formed in the pixel region PXR. The impurity region 103 is a well formed in the peripheral circuit region PRR. The semiconductor substrate 100 has element isolation regions 101 formed from an insulator by STI, selective oxidation (LOCOS), or the like.

An n-type impurity region 104 (first impurity region), a p-type impurity region 112 (second impurity region), and an n-type impurity region 113 are arranged in the semiconductor substrate 100 so that they are surrounded by the impurity region 102 and the surface of the semiconductor substrate 100. The impurity region 112 contains boron (B). The impurity regions 104 and 102 form the photoelectric conversion portion. The impurity region 112 is arranged on the impurity region 104 and is a surface region that gives a buried structure to the photoelectric conversion portion. The upper surface of the impurity region 112 and the surface of the semiconductor substrate 100 coincide with each other. The impurity region 113 functions as a floating diffusion (FD).

In the pixel region PXR, a gate insulating film 106 is arranged on the semiconductor substrate 100. A gate electrode 110 is arranged on, of the semiconductor substrate 100, a region between the impurity regions 104 and 113. In other words, the gate electrode is arranged on, of the semiconductor substrate 100, a portion adjacent to the impurity region 104. The impurity region 104, the impurity region 113, the gate insulating film 106, and the gate electrode 110 constitute a transfer transistor. The n-type impurity region 104 constitutes part of the photoelectric conversion portion and has a function of accumulating charges. An oxide film 109 serving as hard mask is arranged on the upper surface of the gate electrode 110. The gate insulating film 106 exists not only between the gate electrode 110 and the semiconductor substrate 100 but also on the impurity regions 112 and 113. In other words, the gate insulating film 106 on the impurity region 112 extends to a portion between the gate electrode 110 and the semiconductor substrate 100. The lower surface of the gate insulating film 106 contacts the surface of the semiconductor substrate 100. Since the impurity region 104 is located in the surface of the semiconductor substrate 100, the gate insulating film 106 and the impurity region 104 contact each other. The gate insulating film 106 is, for example, a silicon oxide film or a silicon oxynitride film.

In the pixel region PXR, a silicon oxide film 116 is arranged on the semiconductor substrate 100, the gate insulating film 106, and the gate electrode 110. A silicon nitride film 117 is arranged on the silicon oxide film 116, and a silicon oxide film 118 is arranged on the silicon nitride film 117. The lower surface of the silicon oxide film 116 contacts the upper surface of the gate insulating film 106, the side surface of the gate electrode 110, and the upper surface of the oxide film 109. The lower surface of the silicon nitride film 117 contacts the upper surface of the silicon oxide film 116. The lower surface of the silicon oxide film 118 contacts the upper surface of the silicon nitride film 117. That is, the gate insulating film 106 and the silicon oxide film 116 contact each other, the silicon oxide film 116 and the silicon nitride film 117 contact each other, and the silicon nitride film 117 and the silicon oxide film 118 contact each other. The silicon nitride film 117 functions as an antireflection layer. The silicon oxide film 116 is arranged on the photoelectric conversion portion, and the gate insulating film 106 is arranged between the photoelectric conversion portion and the silicon oxide film 116. Of the gate insulating film 106, a portion on the p-type impurity region 112 may contain boron. Of the silicon oxide film 116, a portion on the p-type impurity region 112 may also contain boron. Boron contained in the gate insulating film 106 and the silicon oxide film 116 can typically be boron diffused from the impurity region 112 or may be contained in gas at the time of deposition.

In the impurity region 103, n-type impurity regions 115 and n-type impurity regions 121 are arranged. A gate insulating film 107 is arranged on, of the semiconductor substrate 100, a portion between the two impurity regions 115, and a gate electrode 111 is arranged on the gate insulating film 107. The side surface of the gate electrode 111 is covered with a side wall 120. These constituent elements constitute a MOS transistor having an LDD structure. A silicide layer (not shown) of cobalt silicide, nickel silicide, or the like is provided on the impurity regions 121 and gate electrode 111 of the MOS transistor.

An insulator film 210 covering the gate electrodes 110 and 111 is provided on the semiconductor substrate 100. A contact hole (not shown) is formed in the insulator film 210 and a contact plug connected to the MOS transistor is provided in the contact hole. A plurality of wiring layers 310, 320, and 330 are provided on the insulator film 210. For example, the wiring layer 310 is a wiring layer that has a single damascene structure and mainly consists of copper. The wiring layer 320 is a wiring layer that has a dual damascene structure and mainly consists of copper. The wiring layer 330 is a wiring layer that mainly consists of aluminum. An interlayer insulating film 220 is provided between the wiring layers 310, 320, and 330. The interlayer insulating film 220 can be a multilayered film formed from a plurality of insulating layers. An opening located above the photoelectric conversion portion (above the impurity regions 104 and 112) is provided in the interlayer insulating film 220. A dielectric region 200 formed from a dielectric material is arranged in the opening. The dielectric region 200 is therefore surrounded by the interlayer insulating film 220. In this example, the opening is provided even in the insulator film 210, and the dielectric region 200 has a portion surrounded by the insulator film 210. The dielectric material of the dielectric region 200 is different from the material of at least one of the insulating layers constituting the interlayer insulating film 220. The dielectric material constituting the dielectric region 200 may be a hydrogen-containing silicon compound, and the silicon compound may be silicon nitride or silicon oxide. When the dielectric material contains hydrogen, the surface of the semiconductor substrate 100 can be hydrogen-terminated and the dark current can be reduced. By setting the refractive index of the dielectric region 200 to be higher than that of the interlayer insulating film 220, an optical waveguide structure can be constituted in which the dielectric region 200 functions as a core and the interlayer insulating film 220 functions as a clad. An insulating member 230 is provided on the interlayer insulating film 220 and on the wiring layer 330 provided on the interlayer insulating film 220. The insulating member 230 can include a passivation film, an inner-layer lens, and the like. An optical member 240 is provided on the insulating member 230. The optical member 240 can include a color filter and a microlens.

Figure 3A:
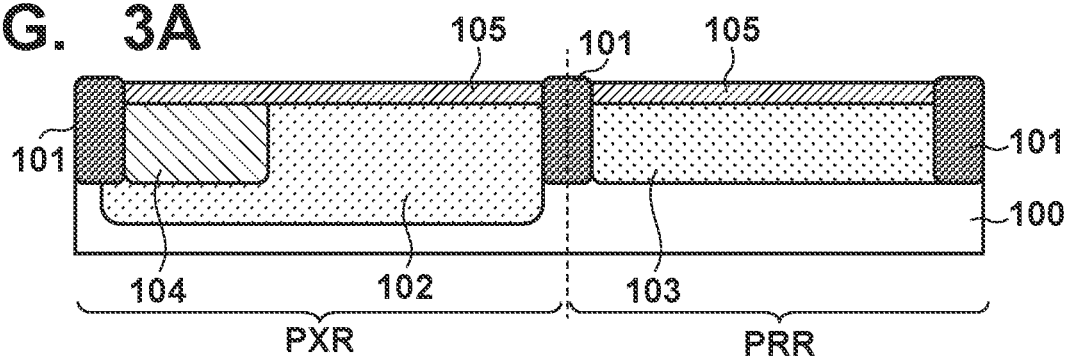
FIGS. 3A to 3D are views for explaining an example of a method of manufacturing the photoelectric conversion device according to the embodiment of the present invention.

A method of manufacturing the photoelectric conversion device AP will be described with reference to FIGS. 3A to 4D. FIGS. 3A to 4D show a position corresponding to FIG. 2. A pad oxide film 105 is formed on the surface of a semiconductor substrate 100 of silicon or the like, and element isolation regions 101 are formed by STI, selective oxidation (LOCOS), or the like. Then, ion implantation is performed, forming a p-type impurity region 102 in a pixel region PXR and a p-type impurity region 103 in a peripheral circuit region PRR. These impurity regions function as well regions. Ion implantation is further performed, forming an n-type impurity region 104 in the impurity region 102. The impurity region 104 constitutes part of a photoelectric conversion portion. By these processes, the structure shown in FIG. 3A is formed.

Figure 3B:
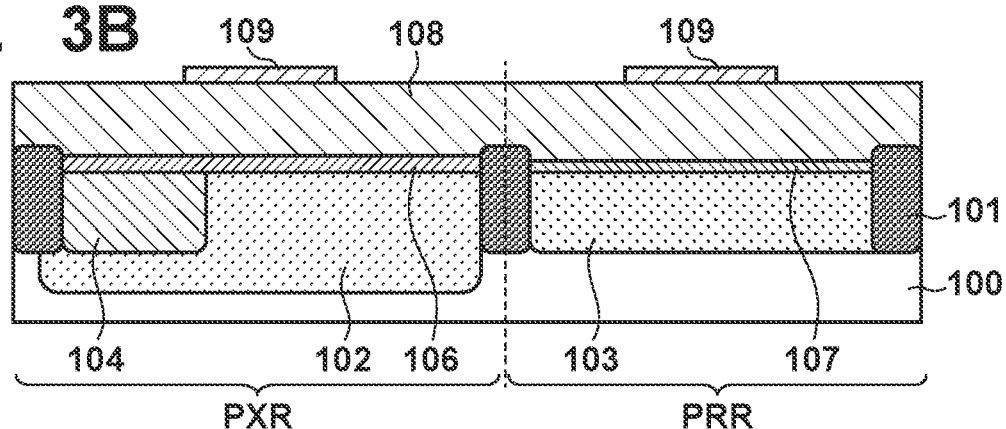

Then, the pad oxide film 105 is removed. A gate oxide film is formed in target regions of the pixel region PXR and peripheral circuit region PRR. Nitriding or oxynitriding is performed on the gate oxide film, forming gate insulating films 106 and 107 on the semiconductor substrate 100. For example, nitriding is achieved by forming a gate oxide film as a base and exposing it to a nitrogen plasma atmosphere at about 400° C. by thermal oxynitriding, plasma nitriding, or the like according to the wet method. The gate insulating films 106 and 107 are silicon oxynitride films. The nitrogen concentration of the gate insulating films 106 and 107 is, for example, about 0.1 to 1.0%. After that, a polysilicon film 108 serving as a gate electrode material is formed on the gate insulating films 106 and 107, and oxide films 109 serving as hard masks are formed on part (portions where gate electrodes are to be formed) of the polysilicon film 108. By these processes, the structure shown in FIG. 3B is formed.

Figure 3C:
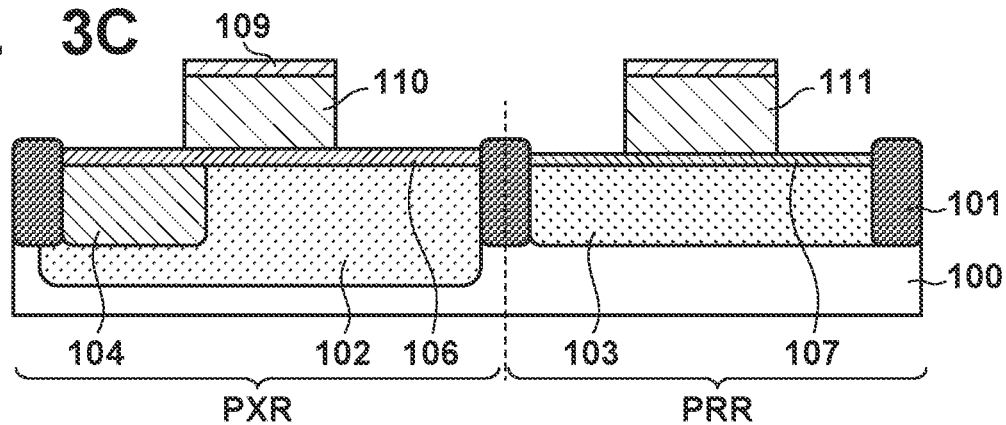

The polysilicon film 108 is etched using the oxide films 109 (hard masks) and a resist mask, forming gate electrodes 110 and 111 from the polysilicon film 108. By these processes, the structure shown in FIG. 3C is formed. In this structure, part of the gate insulating film 106 remains on the impurity region 104.

Figure 3D:
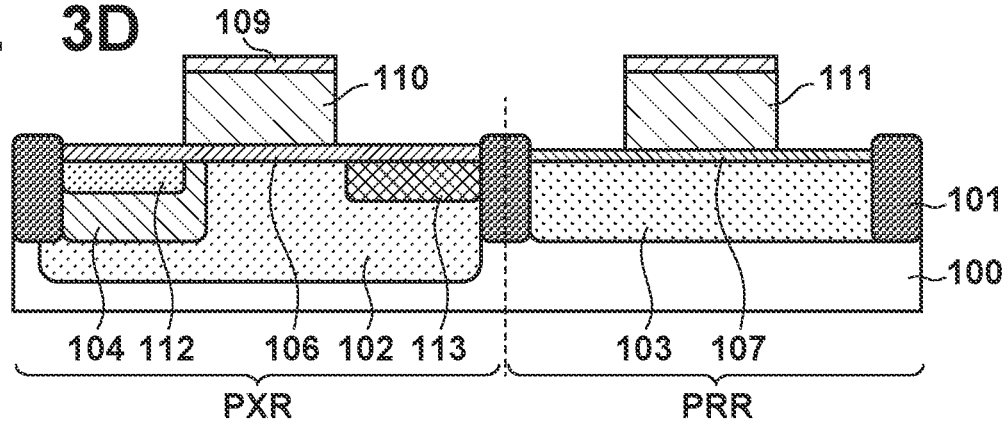

A p-type impurity is ion-implanted in the semiconductor substrate 100 through the gate insulating film 106, forming a p-type impurity region 112 on the impurity region 104. An n-type impurity is ion-implanted in the semiconductor substrate 100 through the gate insulating film 106, forming an n-type impurity region 113. For example, ion implantation for forming the impurity region 112 is performed using an impurity containing boron (B) such as boron difluoride ($BF_2$) at a dose of $1\times10^{13}/cm^2$ to $1\times10^{14}/cm^2$. When the impurity is boron, the acceleration energy is set to 10 KeV or less such as 0.5 to 9 KeV. By performing ion implantation at such a relatively low energy, the impurity is doped near the surface of the semiconductor substrate 100. By these processes, the structure shown in FIG. 3D is formed.

The pixel region PXR is covered with a resist 114. Of the gate insulating film 107 formed in the peripheral circuit region PRR, a portion uncovered with the gate electrode 111, and the oxide film 109 on the gate electrode 111 are removed by wet processing or the like. By these processes, the structure shown in FIG. 4A is formed.

Impurity regions 115 serving as an LDD structure are formed in the peripheral circuit region PRR. When the impurity region 115 is the source or drain of a PMOS transistor, boron difluoride ($BF_2$), boron (B), or indium (In) is used as the impurity. When the impurity region 115 is the source or drain of an NMOS transistor, arsenic (As) or phosphorus (P) is used as the impurity. While the gate insulating film 106 is left around the gate electrode 110 in the pixel region PXR, the gate insulating film 107 is removed from the periphery of the gate electrode 111 in the peripheral circuit region PRR. In the peripheral circuit region PRR, shallow LDD doping is performed. This implements a high-speed transistor with high driving force in the peripheral circuit region PRR and improves the sensor characteristics in the pixel region PXR. By these processes, the structure shown in FIG. 4B is formed.

A silicon oxide film 116 is deposited to contact the semiconductor substrate 100 and the gate electrodes 110 and 111. A silicon nitride film 117 is deposited to contact the silicon oxide film 116. A silicon oxide film 118 is deposited to contact the silicon nitride film 117. The silicon oxide film 118 may be formed at a treatment temperature of 600° C. or less. The silicon oxide film 116 may be formed by performing, for example, low-pressure chemical vapor deposition (LPCVD) using bis(tertiary-butyl-amino)silane (BTBAS) gas as a source gas at a treatment temperature of 520° C. to 550° C. lower than 600° C. Low-pressure chemical vapor deposition (LPCVD) is a kind of chemical vapor deposition (CVD) and is especially classified into thermal CVD. The silicon oxide film 116 can be formed by thermal CVD using a silane-based gas other than BTBAS gas at a deposition temperature lower than 600° C. The silicon oxide film 116 can also be formed by plasma CVD using a silane-based gas at a deposition temperature lower than 600° C. The silicon oxide film 116 can also be formed by vapor deposition other than CVD. For example, the silicon oxide film 116 can be formed using physical vapor deposition such as sputtering, or atomic layer deposition (ALD). The deposition gas in ALD is, for example, tri(dimethylamino)silane (3DMAS: SiH(NMe$_2$)$_3$) or tetra(dimethylamino)silane (4DMAS: SiH(NMe$_2$)$_4$). By these processes, the structure shown in FIG. 4C is formed.

The pixel region PXR is covered with a resist 119, and the silicon oxide film 116, the silicon nitride film 117, and the silicon oxide film 118 in the peripheral circuit region PRR are etched back. As a result, a side wall 120 is formed on the side surface of the gate electrode 111. In the peripheral circuit region PRR, heavily doped impurity regions 121 are formed in the semiconductor substrate 100. The impurity region 121 is self-aligned on the side surface of the side wall 120. By these processes, the structure shown in FIG. 4D is formed. Thereafter, the resist 119 is removed, and other constituent elements are formed. For example, an insulator film 210, an interlayer insulating film 220, and wiring layers 310 and 320 are formed. Of the interlayer insulating film 220 and the insulator film 210, portions located above the photoelectric conversion portion are removed by plasma etching or the like, forming an opening. A dielectric material is buried in the opening by plasma CVD, forming a dielectric region 200. A wiring layer 330, an insulating member 230, and an optical member 240 are formed. In this way, the photoelectric conversion device AP in FIG. 2 is manufactured.

In the above-described manufacturing method, the silicon oxide film 116 is formed at a low temperature (600° C. or less). Since diffusion of boron in the impurity region 112 formed near the surface of the semiconductor substrate 100 is suppressed, entrapment of boron in the silicon oxide film 116 is suppressed. As a result, the boron concentration of the impurity region 112 can be increased, improving the sensor characteristics of the photoelectric conversion device AP. In particular, a white spot and a dark current are reduced. For comparison, when the silicon oxide film 118 is formed using, for example, thermal oxidation at a deposition temperature of 700° C. or more, boron in the impurity region 112 diffuses prominently and the boron concentration of the impurity region 112 decreases. The decrease in the boron concentration of the impurity region 112 increases the white spot and the dark current. Merely increasing the dose to increase the boron concentration is not a sufficient measure because the white spot and the dark current arising from the increase in dose may increase. When forming the dielectric region 200, plasma etching or plasma CVD causes plasma damage in the semiconductor substrate 100. This plasma damage may also increase the white spot and the dark current. It is therefore necessary to increase especially the boron concentration of the impurity region 112 and reduce the white spot and the dark current when providing the dielectric region 200.

Figure 5:
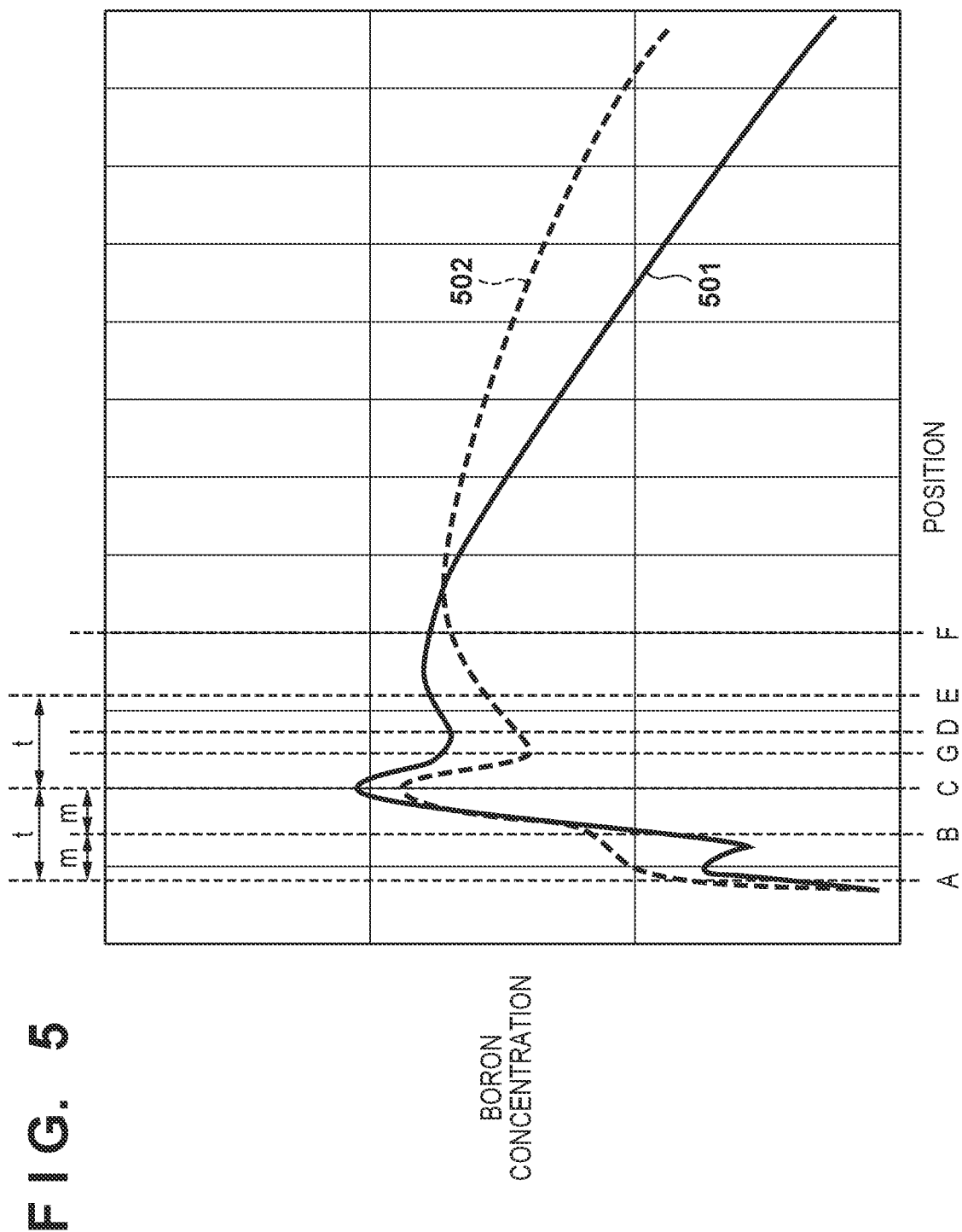
FIG. 5 is a graph for explaining a boron profile in the photoelectric conversion device according to the embodiment of the present invention.

The profile of the boron concentration on a straight line (on a line X-X' in FIG. 2) that crosses (for example, is orthogonal to) the surface of the semiconductor substrate 100 and passes through the impurity region 112 will be explained with reference to FIG. 5. The impurity region 112 constituting the surface region of the photoelectric conversion portion contains boron as an impurity. The gate insulating film 106 and the silicon oxide film 116 contain boron at a position where they cover the impurity region 112. In FIG. 5, a solid line in the graph indicates a profile 501 in the photoelectric conversion device AP manufactured by the above-described method, and a broken line in the graph indicates a profile 502 of a comparison target. In the comparison target, the impurity region 112 is formed by ion implantation at 10 KeV or more, for example, about 13 to 15 KeV, and the silicon oxide film 116 is deposited at a deposition temperature of 620° C. to 660° C. The abscissa of the graph in FIG. 5 indicates a position on the line X-X', and the ordinate indicates a logarithmic boron concentration at each position. The right direction of the abscissa is the depth direction of the semiconductor substrate 100, and the upward direction of the ordinate is the increase direction of the concentration. The unit is a.u. (arbitrary unit) for both the abscissa and the ordinate. The concentration of each element can be measured using X-ray photoelectron spectroscopy (XPS), secondary ion mass spectrometry (SIMS), inductively coupled plasma-mass spectrometry (ICP-MS), rutherford backscattering spectrometry (RBS), or the like. FIG. 5 shows a measurement result by SIMS.

In FIG. 5, a position A is the upper surface of the silicon oxide film 116. In other words, the position A is the interface between the silicon oxide film 116 and the silicon nitride film 117. A position C is the surface of the semiconductor substrate 100. In other words, the position C is the interface between the semiconductor substrate 100 and the gate insulating film 106. The interface between the semiconductor substrate 100 and the gate insulating film 106 is defined as a position where the secondary ion strength of oxygen detected in SIMS measurement exhibits ½ of the maximum strength (peak strength). As is understood from FIG. 5, the position of the peak of the boron concentration is the position C in both the profiles 501 and 502. The boron distribution can be evaluated by comparing the boron concentration on the silicon oxide film 116 side with respect to the position C and the boron concentration on the impurity region 112 side with respect to the position C using the position as the reference position. The distance between the positions A and C is about 12 nm. A position B is an intermediate point between the positions A and C at an equal distance (a distance m) from the position A and the position C. The influence of segregation of boron at the position C out of silicon oxide (the gate insulating film 106 and the silicon oxide film 116) on the semiconductor substrate 100 is relatively small at the position B. The influence of diffusion of boron from the semiconductor substrate 100 is sufficient at the position B. For this reason, the position B is a symbolic position that symbolizes a boron concentration in silicon oxide arising from diffusion of boron to silicon oxide on the semiconductor substrate 100. A distance t between the positions A and C corresponds to the sum of the film thicknesses of the gate insulating film 106 and the silicon oxide film 116. A position E is a predetermined position spaced apart from the position C in the depth direction by the distance t between the positions A and C. That is, the position C is an intermediate point between the positions A and E at an equal distance (the distance t) from the position A and the position E. The position E is a position for evaluating the symmetry of the boron distribution with respect to the position C in consideration of the ease of diffusion of boron in the semiconductor substrate 100 and the silicon oxide. Positions D and G are positions where the boron concentration takes minimal values in the impurity region 112. The range from the position C to the position D or G is said to be a range where the boron concentration is especially high near the surface of the semiconductor substrate 100. More specifically, the position D is a position where the profile 501 advances in the depth direction from the position C and takes a minimal value first. The position G is a position where the profile 502 advances in the depth direction from the position C and takes a minimal value first. The distance between the positions C and D is about 6 nm, and that between the positions C and G is about 4 nm. A position F is a position spaced apart from the position C in the depth direction by 20 nm. The range from the position C to the position F at the depth of 20 nm is a portion where a dark current, a white spot, or the like is readily generated in a typical photoelectric conversion device.

The boron concentration at each position on the profile 501 of the first example is as follows:
position B: $5.5E17/cm^3$
position C: $1.0E19/cm^3$ The boron concentration at each position on the profile 502 of the second example is as follows:
position B: $1.5E18/cm^3$
position C: $7.5E18/cm^3$ The integrated value of the boron concentration between two specific points on the profile 501 of the first example is as follows:
position A to position C: $2.5E12/cm^2$
position C to position D: $4.2E12/cm^2$
position C to position E: $7.6E12/cm^2$
position C to position F: $1.2E13/cm^2$ The integrated value of the boron concentration between two specific points on the profile 502 of the second example is as follows:
position A to position C: $2.6E12/cm^2$
position C to position G: $1.8E12/cm^2$
position C to position E: $4.6E12/cm^2$
position C to position F: $8.3E12/cm^2$ By employing the profile 501 of the first example, a dark current and a white spot, particularly, a white spot can be greatly reduced in comparison with the profile 502 of the second example. This is advantageous especially when the above-described dielectric region 200 is arranged on the photoelectric conversion portion. This is because arranging the dielectric region 200 may cause a dark current and a white spot. A specific form will be explained based on the difference between the profile 502 of the second example and the profile 501 of the first example.

The integrated value of the boron concentration from the position C serving as a reference position to the position D where the boron concentration takes a minimal value may be larger than that of the boron concentration from the position C to the upper surface (the position A) of the silicon oxide film 116. This means a state in which diffusion of boron from the impurity region 112 is suppressed and the boron concentration becomes high near the surface of the semiconductor substrate 100 in the impurity region 112. Therefore, a white spot and a dark current generated near the surface of the semiconductor substrate 100 can be suppressed satisfactorily. The integrated value of the boron concentration from the position C to the position D may be $2.0E12/cm^2$ or more or $3.0E12/cm^2$ or more. The integrated value of the boron concentration from the position C to the position A may be $5.0E12/cm^2$ or less. The integrated value of the boron concentration from the position C to the position A may be $1.0E12/cm^2$ or more. In the first example, the integrated value of the boron concentration of the silicon oxide film 116 is small though the boron doping position is close to the surface of the semiconductor substrate 100, compared to the second example. In the first example, the integrated value of the boron concentration between the positions C and D is larger than that of the boron concentration between the positions A and C. To the contrary, in the second example, the integrated value of the boron concentration between the positions C and G is smaller than that of the boron concentration between the positions A and C.

The boron concentration at the position C serving as a reference position may be higher than five times of the boron concentration at the position B serving as a symbolic position or may be 10 times or more. This means that diffusion of boron to silicon oxide is suppressed and a sufficient amount of boron exists at the position C. In the first example, the boron concentration at the position C is higher than about 18 times of the boron concentration at the position B, is higher than five times, and is 10 times or higher. In the second example, the boron concentration at the position C is about five times of the boron concentration at the position B. The boron concentration at the position B may be $1.0E18/cm^3$ or less. The boron concentration at the position B may be $1.0E17/cm^3$ or more. The boron concentration at the position C may be $1.0E19/cm^3$ or more. The boron concentration at the position C may be $1.0E20/cm^3$ or less.

The integrated value of the boron concentration from the surface (the position C) of the semiconductor substrate 100 to the position E may be larger than that of the boron concentration from the surface (the position C) of the semiconductor substrate to the upper surface (the position A) of the silicon oxide film. In the first example, the integrated value of the boron concentration between the positions C and E is larger than that of the boron concentration between the positions A and C and is larger than two times or more of the integrated value of the boron concentration between the positions A and C. The integrated value of the boron concentration from the position C to the position E may be $5.0E12/cm^2$ or more and may be $6.0E12/cm^2$ or more. The integrated value of the boron concentration from the position C to the position E may be $1.0E13/cm^2$ or less.

The integrated value of the boron concentration from the position C to the position F may be larger than that of the boron concentration from the position C to the position A. This is advantageous for suppressing the influence, on the photoelectric conversion portion, of even a white spot or a dark current generated in a region to the position F from the position C serving as a typical generation source of a white spot or a dark current. In the first example, the integrated value of the boron concentration between the positions C and F is larger than that of the boron concentration between the positions A and C and is four times or more of the integrated value of the boron concentration between the positions A and C. The integrated value of the boron concentration from the position C to the position F may be $1.0E13/cm^2$ or more. The integrated value of the boron concentration from the position C to the position F may be $1.0E14/cm^2$ or less.

This reveals that entrapment of boron in the gate insulating film 106 and the silicon oxide film 116 can be suppressed in the first example. A white spot and a dark current can be reduced by employing a profile in which the concentration of boron to the gate insulating film 106 and the silicon oxide film 116 is decreased and the boron concentration in the impurity region 112 is increased. In particular, a white spot and a dark current can be greatly reduced in a conventional photoelectric conversion device by satisfying the above-mentioned boron concentration or the magnitude relationship or range of the integrated value of the boron concentration.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2017-208513, filed Oct. 27, 2017 which is hereby incorporated by reference herein in its entirety.

What is claimed is:

1. A photoelectric conversion device comprising:
a semiconductor substrate including a photoelectric conversion portion;
a silicon oxide film arranged above the photoelectric conversion portion; and
an insulating film arranged between the photoelectric conversion portion and the silicon oxide film,
wherein an n-type first impurity region constituting part of the photoelectric conversion portion and a p-type second impurity region arranged between the insulating film and the first impurity region are provided in the semiconductor substrate,
wherein the insulating film contains boron above the second impurity region, and the second impurity region contains boron, and
wherein as for a profile of a boron concentration on a straight line that crosses a surface of the semiconductor substrate and passes through the second impurity region, letting a position where the boron concentration takes a minimal value in the second impurity region be a first position, an integrated value of a boron concentration from the surface of the semiconductor substrate to the first position is larger than an integrated value of a boron concentration from the surface of the semiconductor substrate to an upper surface of the silicon oxide film.

2. The device according to claim 1, wherein as for the profile, letting a position spaced apart from the surface of the semiconductor substrate in a depth direction of the semiconductor substrate by a distance between the surface of the semiconductor substrate and the upper surface of the silicon oxide film be a second position, an integrated value of a boron concentration from the surface of the semiconductor substrate to the second position is larger than an integrated value of a boron concentration from the surface of the semiconductor substrate to the upper surface of the silicon oxide film.

3. The device according to claim 1, wherein as for the profile, letting a position spaced apart by 20 nm from the surface of the semiconductor substrate in a depth direction be a third position, an integrated value of a boron concentration from the surface of the semiconductor substrate to the third position is larger than an integrated value of a boron concentration from the surface of the semiconductor substrate to the upper surface of the silicon oxide film.

4. The device according to claim 1, wherein an integrated value of a boron concentration from the surface of the semiconductor substrate to the upper surface of the silicon oxide film is not larger than $5.0E12/cm^2$.

5. The device according to claim 1, wherein a boron concentration at a portion of the silicon oxide film is not less than $1.0E17/cm^3$.

6. The device according to claim 5, wherein the boron concentration at the portion of the silicon oxide film is not more than $1.0E18/cm^3$.

7. The device according to claim 1, wherein a distance between the first position and the surface of the semiconductor substrate is not more than 20 nm.

8. A photoelectric conversion device comprising:
a semiconductor substrate including a photoelectric conversion portion;
a silicon oxide film arranged above the photoelectric conversion portion; and
an insulating film arranged between the photoelectric conversion portion and the silicon oxide film,
wherein an n-type first impurity region constituting part of the photoelectric conversion portion and a p-type second impurity region arranged between the insulating film and the first impurity region are provided in the semiconductor substrate,
wherein the insulating film contains boron above the second impurity region, and the second impurity region contains boron, and
wherein as for a profile of a boron concentration on a straight line that crosses a surface of the semiconductor substrate and passes through the second impurity region, a boron concentration at the surface of the semiconductor substrate is not smaller than 10 times of a boron concentration at an intermediate point between the surface of the semiconductor substrate and an upper surface of the silicon oxide film.

9. The device according to claim 8, further comprising:
an interlayer insulating film arranged above the semiconductor substrate; and
a dielectric region arranged above the photoelectric conversion portion and surrounded by the interlayer insulating film,
wherein the silicon oxide film is arranged between the photoelectric conversion portion and the dielectric region.

10. The device according to claim 9, wherein a material of the dielectric region is a silicon compound containing hydrogen.

11. The device according to claim 8, wherein a boron concentration at an interface between the semiconductor substrate and the insulating film above the second impurity region is $1.0E19/cm^3$ to $1.0E20/cm^3$.

12. The device according to claim 8, further comprising a gate electrode above a portion of the semiconductor substrate that is adjacent to the first impurity region,
wherein the insulating film extends to a portion between the gate electrode and the semiconductor substrate.

13. The device according to claim 8, wherein the insulating film is a silicon oxynitride film.

14. The device according to claim 8, further comprising a silicon nitride film arranged above the silicon oxide film,
wherein the silicon nitride film and the silicon oxide film contact each other.

15. The device according to claim 8, wherein the insulating film and the second impurity region contact each other, and
wherein the silicon oxide film and the insulating film contact each other.

16. The device according to claim 8, wherein the boron concentration at the intermediate point $1.0E17/cm^3$ to $1.0E18/cm^3$.

17. An apparatus comprising:
the photoelectric conversion device according to claim 8; and
a processing device configured to process a signal output from the photoelectric conversion device.

18. A method of manufacturing the photoelectric conversion device according to claim 8, the method comprising:
forming an n-type first impurity region constituting part of a photoelectric conversion portion in a semiconductor substrate;
forming an insulating film above the semiconductor substrate;

forming a p-type second impurity region above the first impurity region by doping an impurity containing boron in the semiconductor substrate through the insulating film; and forming a silicon oxide film above the insulating film at a deposition temperature of not higher than 600° C.

19. The method according to claim 18, wherein in the forming the second impurity region, the impurity is doped at an energy of not larger than 10 KeV.

20. The method according to claim 19, further comprising, after the forming the insulating film and before the forming the silicon oxide film, forming a gate electrode above a portion of the semiconductor substrate that is adjacent to the first impurity region.

21. The method according to claim 19, further comprising, after the forming the silicon oxide film, forming a silicon nitride film so as to contact the silicon oxide film.

22. The method according to claim 18, wherein the silicon oxide film is formed by thermal CVD using bis(tertiary-butyl-amino)silane (BTBAS) gas.

23. A photoelectric conversion device comprising:
a semiconductor substrate including a photoelectric conversion portion;
an interlayer insulating film arranged above the semiconductor substrate;
a dielectric region arranged above the photoelectric conversion portion and surrounded by the interlayer insulating film;
a silicon oxide film arranged between the photoelectric conversion portion and the dielectric region; and
an insulating film arranged between the photoelectric conversion portion and the silicon oxide film, wherein an n-type first impurity region constituting part of the photoelectric conversion portion and a p-type second impurity region arranged between the insulating film and the first impurity region are provided in the semiconductor substrate, wherein the insulating film contains boron above the second impurity region, and the second impurity region contains boron, and wherein as for a profile of a boron concentration on a straight line that crosses a surface of the semiconductor substrate and passes through the second impurity region, letting a position spaced apart from the surface of the semiconductor substrate in a depth direction of the semiconductor substrate by a distance between the surface of the semiconductor substrate and an upper surface of the silicon oxide film be a predetermined position, an integrated value of a boron concentration from the surface of the semiconductor substrate to the predetermined position is larger than an integrated value of a boron concentration from the surface of the semiconductor substrate to the upper surface of the silicon oxide film and is not smaller than $5.0E12/cm^2$.

24. The device according to claim 23, wherein a boron concentration at a portion of the silicon oxide film is not less than $1.0E17/cm^3$.

25. The device according to claim 24, wherein the boron concentration at the portion of the silicon oxide film is not more than $1.0E18/cm^3$.

26. The device according to claim 23, wherein a distance between the predetermined position and the surface of the semiconductor substrate is not more than 20 nm.

* * * * *